United States Patent [19]

McMillan

[11] Patent Number: 4,549,082
[45] Date of Patent: Oct. 22, 1985

[54] SYNTHETIC PLASMA ION SOURCE
[76] Inventor: Michael R. McMillan, 1905 Cathy La., #203, McLean, Va. 22102
[21] Appl. No.: 486,526
[22] Filed: Apr. 19, 1983
[51] Int. Cl.$^4$ ............................................. H01J 27/00
[52] U.S. Cl. ................................ 250/423 R; 250/427; 315/111.81
[58] Field of Search ........................... 250/423 R, 427; 315/111.81; 376/127, 116; 313/359.1, 362.1

[56] References Cited
U.S. PATENT DOCUMENTS

| | | |
|---|---|---|
| 3,616,596 | 11/1971 | Campargue . |
| 3,846,668 | 11/1974 | Ehlers et al. .................... 250/423 R |
| 3,914,655 | 10/1975 | Dreyfus et al. . |
| 4,318,028 | 3/1982 | Perel et al. ....................... 250/423 R |
| 4,475,063 | 10/1984 | Aston ............................... 315/111.81 |

OTHER PUBLICATIONS

"High Intensity Supersonic Molecular Beam App.", Campargue, *Rarified Gas Dynamics*, Supp. 3, vol. II, 1966, Academic Press.
"Crossed-Molecular-Beam Study of the Kinematics and Dynamics of Charge-Transfer Collisions", Kaiser 51.41, *Jour. of Chemical Phy.*, vol. 61, No. 7, Oct. 1974.
Q Machines, Motley, Academic Press, 1975.
*Focusing of Charged Particles*, Septier, "Production of Ion Beams of High Intensity", Academic Press 1967, pp. 123–149.
"Optimization of the Trochoidal Electron Monochromator", McMillan et al., *Rev. of Sci. Inst.*, 51677, Jul. 1980.
"Ionic and Plasma Propulsion for Space Vehicles", Brewer et al., Proceeding of the IRE, vol. 49, #12, 1961.

*Primary Examiner*—Bruce C. Anderson

[57] ABSTRACT

An improved crossed-beam charge-exchange ion gun in which a synthetic plasma is formed by injecting an electron beam into a collimated molecular beam just before the molecules are ionized by charge exchange with a crossed primary ion beam, thereby forming a secondary ion beam from the ionized but space-charge-neutralized and substantially undeflected molecular beam. The plasma thus formed extends to an aperture stop in an aperture tube which extends upstream from an anode downstream of which anode a cathode is placed. A field is formed within the cathode/anode space and within the aperture tube into which the plasma extends. The sheath edge of the plasma within the tube is curved by the field to form a meniscus, and the aperture, being smaller in area than the secondary ion beam upstream of the aperture, both collimates the secondary ion beam and acts as a lens stop for the subsequent immersion lens formed by the meniscus and the field region.

28 Claims, 4 Drawing Figures

SYNTHETIC PLASMA ION SOURCE

BACKGROUND OF THE INVENTION

This invention relates to ion sources and especially to an ion source utilizing a charge exchange process to change a molecular beam to an ion beam.

Ion beam sources have found various applications, one being in the fabrication of integrated circuits. Integrated circuit fabrication is now beginning a new phase. A few years ago, the goal was the fabrication of very large scale integrated circuits (VLSI) in which as many functions as possible were crowded on one chip. Now there is a drive to develop very high speed integrated circuits (VHSIC), in which the objective is to increase speed by shrinking components to submicron dimensions. For the initial stages of VHSIC work, electron beam microlithography is being used.

The objective of particle beam lithography is to write a pattern on a semiconductor surface with a tiny focused spot of charged particles. This pattern can then be treated to form an integrated circuit. Essential to this process is the source of the charged particles; the closer it is to being an ideal monochromatic point source, the smaller the final spot size can be. Also, the more current the source produces, the faster the pattern can be written. A means is described herein which constitutes such a nearly ideal ion source, superior to any previous charged particle source intended for microlithography.

Ions have an advantage over electrons in being approximately one hundred times more effective at exposing resist material used in chip fabrication. This would reduce the cost/wafer/hour for an ion beam of the same current and spot size as an electron beam.

Another advantage of ions over electrons is that much greater resolution is possible, due to the absence of backscattering by the substrate (the proximity effect).

Ions also permit entirely new techniques to be used. $SiO_2$ can be exposed directly, without first exposing a layer of resist. Etching of $SiO_2$ by sputtering could be done directly and this step could be followed immediately by implantation within the same vacuum chamber.

OBJECTS OF THE INVENTION

An object of this invention is to provide a charged particle source having higher current, smaller spot size and more efficiency than other charged particle sources.

Another object is to provide a charged particle source which avoids the backscattering effect exhibited by electron beam sources.

A further object is to provide intense ion beams.

SUMMARY OF THE INVENTION

The objects and advantages of the present invention are achieved in a crossed-beam charge-exchange ion gun by utilizing an electron beam to form a synthetic plasma by projecting electrons into the region where a positively charged ion beam is projected through a molecular beam of the same gas species, e.g., Argon, as the ion beam. The charged ions ionize the molecules and the ions in the newly formed ion beam are kept from flying apart by the neutralizing effect on their charges of the intermingled electrons.

A second aspect of the invention is the use of an aperture both as a beam collimator and an aperture stop (also known as a lens stop) to improve the optical qualities of an immersion lens. The immersion lens includes the lens formed by the curvature at the ion-emitting edge of the plasma plus the field in the volume of the sheath extending from the curved edge of the plasma to the cathode.

With respect to conventional plasma ion sources, e.g., Duoplasmatrons, the present invention provides a cold, collimated ion beam in the plasma before extraction. The invention provides improvements over liquid metal and field ionization sources in that it effects ionization in a field-free region, leading to less spherical and chromatic aberration, and also makes the attainment of greater currents possible. Relative to previously reported molecular-beam ion sources, the invention provides means for extracting intense beams, rather than just individual ions, by converting the beam source to a hybrid beam/plasma source.

Some fields to which the present invention has application are the following:

(a) Lithography: direct and indirect (mask-making);
(b) Micromachining and etching by sputtering;
(c) Materials analysis (secondary ion mass spectroscopy) (SIMS), induced X-rays, Auger spectrometry);
(d) Microscopy (scanning and transmission);
(e) Ion implantation.

DETAILED DESCRIPTION OF THE INVENTION

Figure 1:
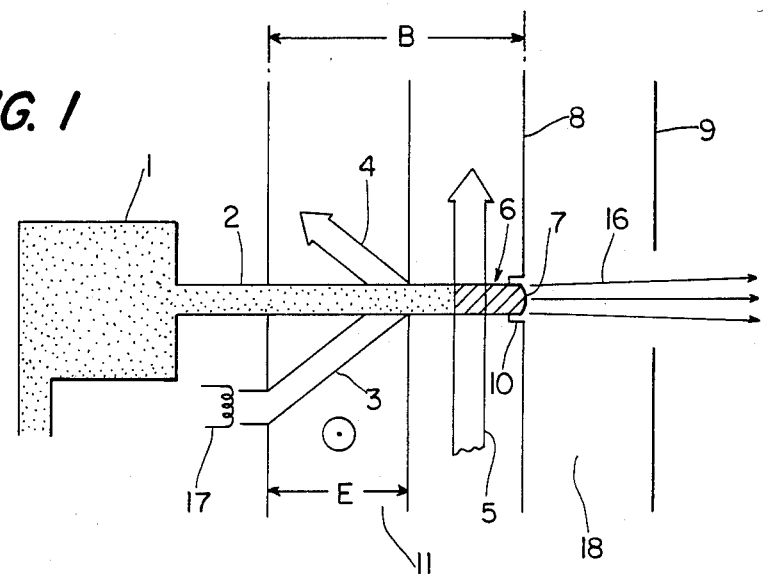
FIG. 1 is a schematic diagram showing an ion beam source in accordance with the invention.

FIG. 1 shows in schematic form the essential features of a molecular-beam charge-exchange ion source in accordance with the present invention. A gas reservoir 1 contains a pressurized gas, preferably a noble gas such as argon (Ar) or helium (He). The high-pressure gas (assume Ar) is allowed to exit from the reservoir through a small hole in a nozzle 12 (see FIG. 3) into an evacuated region. Since the pressure at first is high, the gas undergoes hydrodynamic flow as it emerges from the nozzle 12, and then makes a transition to molecular flow. This process produces a very intense beam. Following the nozzle 12, are an aperture 13, called a skimmer, and a subsequent aperture 14 called a collimator. These apertures produce a cylindrically symmetric collimated molecular beam 2.

A gun that can be used to form the molecular beam is shown and described in U.S. Pat. No. 3,616,596, issued to R. Campargue on Feb. 17, 1969, and in a section by R. Campargue in the book entitled "Rarefield Gas Dynamics, Supp. 3, Vol. II, published in 1966 by Academic Press, N.Y., editor J. H. Leeuw, the section being called "High Intensity Supersonic Molecular Beam Apparatus", Pgs. 279-298 (see, especially, FIG. 1 which corresponds in general to FIG. 3 herein).

An electron beam 3, preferably of low-energy electrons, e.g., a few tenths of an eV, is formed by an electron emitting filament 17 and projected through a drift region 11 where it is subjected to an EXB field which bends its path to make the path coincide with that of the molecular beam 2 so that electrons intermingle with Ar molecules in the combined beam. A primary ion beam 5 of positively charged argon ions ($Ar^+$) is orthogonally projected through the intermingled electron-molecule beam in an ionization region where the beams cross. The ions in the primary ion beam may be of any gaseous species having an ionization potential fairly close in value to that of the gaseous species forming the molecular beam. A charge exchange by means of a electron tunneling process occurs which transfers positive charge from the primary beam $Ar^+$ ions to the neutral Ar molecules, resulting in a secondary ion beam moving substantially undeflected through a plasma region 6. The plasma extends through a small aperture 10 in a tube 10' formed in an anode 8. Spaced downstream of the anode 8 is a cathode 9. The electrons are reflected backwards by the field set up between the anode and cathode and the substantially electron-free region 18 of the secondary ion beam between the plasma and the cathode 9 is called the sheath. The sheath edge 7 abuts the edge of the plasma 6 which projects through the aperture stop 10 into the aperture tube 10'.

The plasma produced by projection of electrons into a region containing ions is called a synthetic plasma. The synthetic plasma region 6 includes the region of intersection of the molecular and ionic Ar beams. If the plasma is produced sufficiently close to the edge of the sheath, only a small percentage of the secondary ions will be neutralized by recombination with electrons. The edge of the sheath which abuts the plasma projecting through the aperture 10 forms a meniscus, which is part of an immersion lens ion-optical properties of the lens and the curvature of the meniscus being controllable by varying the ion density or the cathode-anode (i.e., the extractor) potential. The meniscus alters the secondary ion beam so that it acts as though it emanates from a point source, i.e., the meniscus provides the beam with a virtual or real focal point (point source) depending on the concavity or convexity of the meniscus respectively. The beam, as it continues on its course, is then bent by the field in the sheath so that the beam still forms a very small point of focus (small in comparison to the focus area of conventional ion beam guns).

Figure 2A:
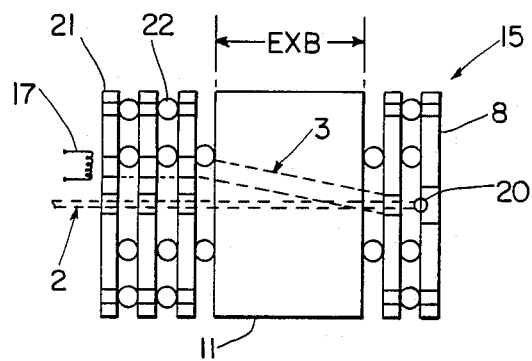
FIG. 2a is a simplified schematic diagram of a trochoidal monochromator used in the invention.
Figure 2B:
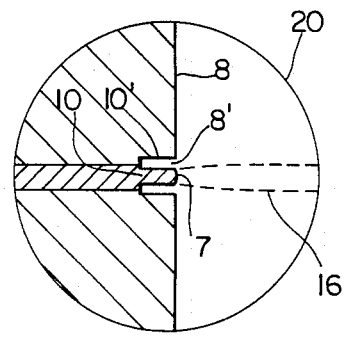
FIG. 2b is a schematic diagram showing a blow-up of a small area of FIG. 2a showing the charge-exchange area, the aperture tube in the anode and the secondary ion beam.

The part of the plasma which lies to the right of the lens, or apertures, stop 10 is called the plasma column herein. The plasma column exists because the ions therein are collimated by coming through the lens stop 10 and are confined radially by their directed motion, not by walls or the magnetic field. Therefore, the column is called free-standing. The shape and position of the meniscus 7 formed at the junction between the downstream edge of the plasma and the upstream edge of the sheath is shown in FIG. 2b. The meniscus may be converging or diverging although the latter is preferable. The immersion lens (immersion objective) comprises the meniscus and the sheath field, the optical properties of the immersion lens (and the position and shape of the meniscus) depending in a calculable way on the internal plasma conditions, such as electron temperature, ion kinetic energy and ion density, and the shapes of, and the voltage difference between, the anode and cathode.

Figure 3:
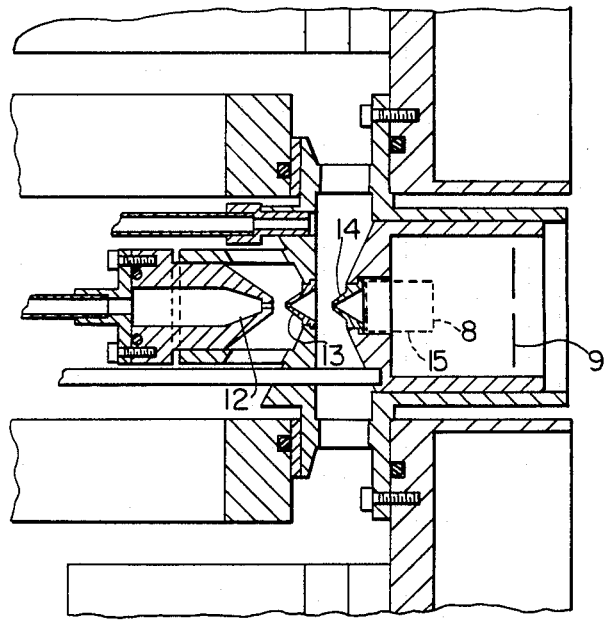
FIG. 3 is a partial cross-sectional view of an ion gun for use in the invention.

A molecular beam gun structure which can be employed is that shown in FIG. 3. This structure is known in the art and is modified in accordance with the present invention by introducing immediately after the collimator 14 a trochoidal monochromator, shown in FIG. 2a, an anode 8 and a cathode 9, which are both coaxial and cylindrically symmetric. The monochromator has a series of spaced plates 21 before and after a drift region 11 in which crossed electric (E) and magnetic (B) fields bend the electron beam 3 into coincidence with the molecular beam 2. FIG. 1 shows the axial length over which the B-field must extend. In practice, however, it will extend over a more extensive length since it is difficult to confine the magnetic field. The anode 8, with its aperture 10', is formed from the final plate of the monochromator, the various elements of which are separated by sapphire balls 22.

The electrons travelling in the secondary ion beam before they are reflected at the plasma/sheath edge prevent the slow-moving $Ar^+$ ions in the secondary ion beam from flying apart due to like-charge repulsion. Thus, adding the electrons maintains the collimation of the ion beam originally established in the molecular beam. Also, the optics of the immersion lens beginning at the plasma/sheath edge is improved by using the aperture 10 both as a collimator and a lens stop. The collimated molecular beam emerging from the collimating hole 14 still has some divergence and the tube aperture 10 acts to collimate the secondary ion beam still further. In addition, the area of the aperture 10 is made smaller than the cross-sectional area of the anode aperture 8' so that the aperture 10 acts as a lens stop, thereby avoiding the spherical aberration in the immersion lens that would result if the plasma made contact with the anode aperture 8'.

Best-mode parameters for the elements of the ion gun are as follows:

(a) distance from nozzle to interaction (charge exchange) region: 5 cm.
(b) gas density at ionization region: $\simeq 1 \times 10^{13}$ cm$^{-3}$
(c) primary ion current: 10–100MA.
(d) secondary ion kinetic energy within the plasma: 0.063 eV
(e) plasma electron temperature: 0.1 eV
(f) aperture tube length$\simeq$aperture tube radius
(g) anode filling factor (plasma column diameter/anode tube diameter): $\sim$0.6
(h) extraction field strength: $\sim$0.6 V/micron
(i) B $\sim$100 Gauss
(j) trochoidal monochromator parameters transverse drift distance, 1.6 mm; distance between the drift electrodes, or "dees", 1.6 mm; voltage between "dees", a few tenths of a volt. For a discussion of the monochromator, see, for example, "Optimization of the trochoidal electron monochromator," McMillan and Moore, Rev. Sci. Instrum. 51(7), Jul. 1980, and reference cited therein.

For a given set of ion source parameters, the extraction voltage (between anode and cathode) can be "tuned" to give a beam with the least spherical aberration for those parameters.

Table 1 gives best results obtained for ion beam performance when tuning is done in a computer simulation of ion extraction with an immersion lens of the type shown in FIG. 1.

TABLE 1

| Plasma Column Diameter (microns) | Final Beam Energy (keV) | Final Beam Diameter (Spot Size) (microns) | Beam Current ($\mu$ amps) |
| --- | --- | --- | --- |
| 24 | 10 | 0.1 | 0.4 |
| 24 | 100 | 0.03 | 0.4 |

TABLE 1-continued

| Plasma Column Diameter (microns) | Final Beam Energy (keV) | Final Beam Diameter (Spot Size) (microns) | Beam Current ($\mu$ amps) |
| --- | --- | --- | --- |
| 80 | 10 | 0.3 | 4.4 |
| 80 | 100 | 0.1 | 4.4 |

A variation of the invention consists in eliminating the tube 10' in favor of an aperture in each of a pair of spaced plates, the second, or downstream, plate acting as the anode and having the larger aperture size, and the first, or upstream, plate having the same potential as the anode and having a smaller aperture size. As can be seen, this arrangement is the equivalent of the tube arrangement since the area of the tube frontal aperture 10 is smaller than the area of the aperture 8' in the anode 8. The area of the anodic aperture 8' is, of course, the same as the cross-sectional area of the aperture tube 10'.

In another variation of the invention, the electrons could be projected into the molecular beam in the region in which the primary ion beam is being injected; in this case, no B-field is present.

In a further variation of the invention, ionization of the molecular beam could be effected by subjecting the beam to electromagnetic radiation.

Other variations in structure are possible. For example, the anode and cathode do not have to be in the form of straight plates but could be formed with surfaces of revolution. For example, to obtain less spherical aberration, the anode could be arcuate, either convexly or concavely. A grid (Wehnelt) electrode, which is common in the art, could be inserted between the anode and the cathode to further shape the field of the immersion lens. Also, although in crossed-beam ion guns, the preference is to make the beams cross orthogonally, this does not necessarily have to be the geometrical configuration that is employed. Moreover, while the electron beam has been shown as being intermingled with the collimated molecular beam prior to its ionization, it is equally possible to inject the electrons at the point of ionization or thereafter.

What has been described herein is an improved ion beam source which employs a charge-exchange process and a low-energy-electron beam to form a synthetic plasma of ions and electrons. The low-energy electrons shield the ionization region from the extraction region, prevent secondary ions from being unduly accelerated and dispersed before reaching the extraction region, and provide a controllable plasma meniscus at the sheath edge. High intensity, collimation and monochromaticity (low temperature) is achieved while the beam is still in the molecular, uncharged state. A B-field is provided which, in addition to its use in the trochoidal monochromator, confines low-energy electrons to the molecular beam and plasma region, suppresses plasma instabilities driven by the primary beam and removes hot electrons.

Obviously, many modifications and variations of the present invention are possible in light of the above teachings. It is therefore to be understood that, within the scope of the appended claims, the invention may be practiced otherwise than as specifically described.

I claim:

1. An ion beam source comprising:
   means for forming a collimated molecular beam of gas atoms;
   means for generating low-energy electrons and adding them to the collimated molecular beam;
   means for forming a primary beam of ions of a species of atoms having an ionization potential similar in value to the particles in said molecular beam and projecting said primary ion beam through said molecular beam in a region of ionization to form a substantially undeflected secondary ion beam;
   a synthetic plasma being formed thereby in the region of ionization and downstream thereof; and
   electrode means for forming an electrostatic field for extracting secondary ions from the downstream edge of the plasma.

2. The ion beam source defined in claim 1, wherein: said electrode means forms an immersion lens.

3. The ion beam source defined in claim 2, wherein said electrode means comprises:
   an anode and cathode, said anode being formed with a pair of shaped apertures, coaxial with each other and with said secondary ion beam, the upstream aperture being smaller in diameter than both the downstream aperture and the cross-sectional area of the upstream secondary ion beam, so that the upstream aperture forms a lens stop.

4. The ion beam source defined in claim 2, wherein said electrode means comprises:
   a pair of electrodes for forming an electrostatic field, one said electrode formed with a tube having its axis in the direction of travel of said secondary beam, said tube having an aperture therein smaller in diameter than said tube and forming a lens stop, said aperture being formed in the end thereof closest to ionization region, the field between the electrodes permitting the plasma to extend through the aperture into the tube and forming the downstream edge of the plasma within the tube into one end of a lens.

5. An ion beam source comprising:
   means for forming a collimated molecular beam of gas atoms;
   means for forming a primary beam of ions of a species of atoms having an ionization potential similar in value to the particles in said molecular beam and projecting said primary ion beam through said molecular beam in a region of ionization to form a substantially undeflected secondary ion;
   means for generating low-energy electrons and adding them to the collimated molecular beam in the region and upstream of the region of ionization,
   a synethetic plasma being formed thereby in the region of ionization and downstream thereof;
   aperture means formed with a first aperture smaller in the area than the cross-sectional area of the secondary ion beam, said aperture being located in the path of said secondary ion beam to be axially coincident with said beam; and
   ion extraction means for producing an electric field for accelerating said secondary ion beam, said extraction means formed with an aperture greater in area than said first aperture and located to be axially coincident with said first aperture,
   said plasma extending through said first aperture and coacting with said electric field so that the plasma edge is curved to form a lens for said secondary ion beam.

6. An ion beam source as defined in claim 5, wherein: said ion extraction means comprises an anode and a cathode spaced downstream thereof, the anode being formed with a tube extending upstream thereof to form said aperture means, the upstream end of the tube being formed with said first aperture therein and the downstream end of said tube comprising said second aperture.

7. An ion beam source as defined in claim 6, wherein: said primary ion beam is projected orthogonally through said molecular beam.

8. An ion beam source as defined in claim 6, wherein: said gas forming the molecular beam is argon.

9. An ion beam source as defined in claim 6, wherein: said gas forming the molecular beam is helium.

10. A synthetic plasma source comprising:
means for forming a secondary ion beam from crossed molecular and ion beams by means of charge exchange between the beams; and
electron beam means for generating an electron beam and bending it upstream of where said molecular beam crosses said ion beam into coincidence with the molecular beam so that ionization of the molecules occurs in the presence of intermingled electrons, and the secondary ion beam contains intermingled electrons traveling in the same direction whereby a synthetic plasma is formed.

11. A synthetic plasma source as defined in claim 10, further including:
aperture means placed in the path of said secondary ion beam to form a lens stop therefor.

12. A synthetic plasma source as defined in claim 10, further including:
aperture means formed with a first aperture smaller in area than the cross-sectional area of the secondary ion beam, said aperture being located in the path of said secondary ion beam to be axially coincident therewith; and
ion extraction means for producing an electric field for accelerating said secondary ion beam and reflecting said electrons, a part of said extraction means formed with a second aperture greater in area than said first aperture and located to be axially coincident with said first aperture,
said plasma extending through said first aperture and coacting with said electric field so that the plasma edge is curved to form one end of a lens for said secondary ion beam.

13. A synthetic plasma source as defined in claim 12 wherein:
said aperture means and said part of said ion extraction means are at the same electric potential.

14. A synthetic plasma source as defined in claim 12, wherein:
said ion extraction means comprises an anode and a cathode located downstream of said anode, said anode being formed with a tube therein extending upstream of said anode,
the upstream end of said tube being formed with said first aperture and the anode end of said tube forming said second aperture.

15. An electrostatic immersion lens for an intense ion source, comprising:
a cathode;
an anode spaced from said cathode;
means for forming a substantially cylindrical, free-standing column of plasma,
said anode and cathode having apertures therein, the axes of said apertures and said column of plasma being coaxial;
the plasma column being located substantially to one side of the anode aperture, and the cathode being located on the other side,
the cross-sectional area of the plasma column being smaller than the area of the anode aperture;
means for providing a voltage difference between said anode and cathode,
the field produced by said voltage difference acting to form a meniscus at the downstream edge of the plasma column, the meniscus being roughly coincident with a plane containing said anode aperture, ions being extracted from the meniscus edge of said plasma column toward said cathode.

16. An immersion lens as defined in claim 15, wherein:
the anode and cathode are formed as non-planar surfaces of revolution.

17. An immersion lens as defined in claim 15, wherein:
said anode aperture is preceded by a lens-stop aperture which aids in forming the plasma column.

18. An immersion lens as defined in claim 17, wherein:
said lens-stop aperture and said anode aperture are joined by a tube of conducting material.

19. An immersion lens as defined in claim 15, wherein:
said anode, cathode and means forming a lens-stop aperture are each formed from a thin sheet of electrically conductive material, each sheet being placed orthogonally to the aperture and plasma column axes, the apertures being arranged in the sequence of lens stop, anode aperture and cathode aperture.

20. A method for forming a synthetic plasma comprising the steps of:
forming an ionized but substantially undeflected molecular beam, the ions being formed in a specific region of ionization;
forming a plasma from said ionized beam by neutralizing the space charge of the ionized molecular beam by intermingling low kinetic energy electrons originating outside the ionized molecular beam.

21. A method as defined in claim 20, wherein:
the molecular beam is ionized by a process of charge exchange.

22. A method as defined in claim 20, wherein:
the molecular beam is ionized by electromagnetic radiation.

23. A method as defined in claim 20, wherein:
the electron kinetic energy is adjustable.

24. A method as defined in claim 20, including the further step of:
passing the plasma through a collimating aperture to form a substantially cylindrical plasma column of uniform density and known diameter.

25. A method as defined in claim 20, wherein:
the electrons are confined radially with a uniform axial magnetic field.

26. A method as defined in claim 20, wherein:
the average electron kinetic energy in the plasma is set equal to a few tenths of an electron volt.

27. A method as defined in claim 20, wherein:
the average electron kinetic energy in the plasma is set at a value of approximately a tenth of an electron volt.

28. A method for forming a synthetic plasma comprising the steps of:
using charge exchange between atoms of a neutral molecular beam and ions of a crossed ion beam to form an ionized but substantially undeflected molecular beam from the neutral molecular beam, the ions being formed where the beams cross;
forming a plasma from said iodized beam by neutralizing the space charge of the ionized beam by injecting into said neutral molecular beam upstream of the region of ionization a beam of electrons originating outside the neutral molecular beam, so that the electrons flow into the ionized beam to form a plasma.

* * * * *